June 5, 1951 W. F. SANDS 2,555,511

VARIABLE PERMEABILITY TUNING SYSTEM

Filed April 9, 1946

INVENTOR
WILLIAM F. SANDS
BY H. G. Grover
ATTORNEY

Patented June 5, 1951

2,555,511

UNITED STATES PATENT OFFICE 2,555,511

VARIABLE PERMEABILITY TUNING SYSTEM

William F. Sands, Haddonfield, N. J., assignor to Radio Corporation of America, a corporation of Delaware Application April 9, 1946, Serial No. 660,599

9 Claims. (Cl. 250—40)

Figure 1:
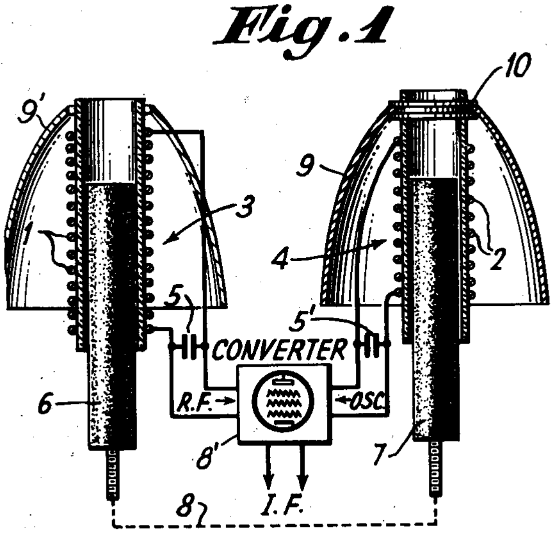

My present invention relates in general to a variable permeability tuning system for a superheterodyne receiver, and more particularly to a tuning system of the type mentioned wherein there is employed simple and novel means to effect tracking between the signal frequency and oscillator circuits of such receiver throughout its tuning range.

In receivers of the superheterodyne type it is essential for satisfactory operation that the resonant frequency of the signal (or antenna) circuit differ from that of the oscillator circuit by substantially a constant amount, this difference frequency being commonly known as the intermediate frequency. It is the usual practice to tune the oscillator circuit through a frequency range higher than the range through which the signal circuit is tuned. As a result, in order to insure a constant frequency difference, the frequency range of the oscillator circuit must be narrower, and if the variable tuning elements of the two circuits are to be uni-controlled, as it is the usual practice, suitable means must be provided whereby the frequency variation of the oscillator circuit is "slowed up" in order to keep in step with the frequency variation of the signal circuit.

It is therefore one of the objects of my invention to provide, in a superheterodyne radio receiver, an improved variable permeability tuning system for causing the oscillator and signal input circuits to track accurately one with the other at a multiplicity of points throughout a predetermined frequency range.

There are several known methods and means for effecting tracking in the tuning of two or more circuits by variable permeability tuning means, some of which are impracticable because of cost or manufacturing difficulties. One method of securing tracking in a permeability-tuned superheterodyne receiver for the broadcast band uses a variable-pitch winding on the oscillator coil. Another method that has been used is disclosed and claimed in the patent to V. D. Landon, No. 2,248,242, assigned to the same assignee as the present application, and involves the use of a larger diameter oscillator coil than the signal frequency coil and the connection of an adjustable capacitor across a portion of the oscillator coil at the core-entering end of the latter coil.

In accordance with my present invention, I avoid the use of variable-pitched windings, coils of different diameters, etc., but I make use of an element of the core and coil assembly which previously has not been given consideration with respect to the tracking problem, namely, the shield-can or enclosure. It is well known in the art that the effect of placing a metallic shield around a coil is that of reducing the effective inductance of the coil, and the amount of inductance reduction is a function of the geometry of the coil and of the shield can. I utilize this phenomenon to carry out the various objects of my invention by placing a shield can around the oscillator coil and obtaining in that way the required shortening of the oscillator tuning range, assuming that the frequency of the oscillator circuit is higher than that of the signal circuit.

A further object of my invention is to associate the coil of the oscillator circuit in a superheterodyne receiver with an external shield member of such configuration that in tuning the receiver over its tuning range the oscillator circuit will be caused to track accurately with the signal frequency circuit.

Other objects and advantages of the invention will be best understood by a consideration of the following description taken together with the accompanying drawing, wherein Figs. 1 through 6 illustrate several embodiments of the present invention.

Referring now to Fig. 1 which illustrates the variable permeability tuning system of a superheterodyne receiver in diagrammatic fashion, 1 and 2 are solenoid inductance coils or windings in two conjointly tunable circuits 3 and 4, respectively, representing the signal frequency and local oscillator circuits of the receiver. The circuits are provided with shunt tuning capacitors 5, 5' and are variable and tunable by means of movable magnetic tuning cores 6 and 7 actuated by suitable tuning control means 8 indicated diagrammatically by the dotted-line connection between the tuning cores. Although any conventional frequency converter system may be employed, there is shown at 8' a single tube converter system to which the signal frequency circuit 3 and the oscillator circuit 4 are coupled and from the output of which the resultant intermediate frequency is derived. As mentioned above, since it is customary to tune the oscillator circuit above the signal or radio frequency circuit, the oscillator circuit is required to be tuned through a narrower range. In order to accomplish this a metallic shield-can is placed around the oscillator coil, the effect of which, as explained above, is to "slow up" the inductance-change of this coil as compared to the inductance-change of the signal frequency coil. This provides two end tracking points. In order to obtain one or more additional tracking points the shield-can is suitably shaped, tapered or given such configuration to produce the desired tracking relation. By way of example a tapered shield-can is shown at both 9 and 9' in Fig. 1, the spacing from the coil surface increasing gradually toward the coil end at which the tuning core enters. The small end of the shield is supported from the coil form at the other end of the coil by suitable means such as a bushing or grommet 10. Obviously, the effect of the shield in controlling the inductance-change is a function of the shield diameter (that is, its spacing from the surface of the coil) at each point along the length of the coil, so that by means of a properly dimensioned shield-can, substantially perfect alignment or tracking across the entire tuning range can be obtained.

Figure 2:
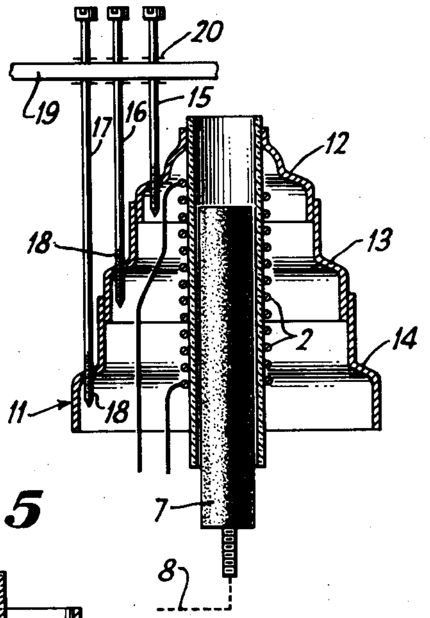

In Fig. 2 there is shown a shield-can 11 of somewhat different construction which comprises a plurality of bell-shaped, telescoped sections 12, 13 and 14. The smaller diameter section 12 is shown frictionally retained on the coil form of coil 2. Alternatively, this section may be held in position by means of a bushing or grommet as in Fig. 1. The other sections 13 and 14 are held together by the force of friction between the telescoped annular portions of adjacent section and are capable of axial adjustment with respect to each other and to the fixed section 12. In the manufacture of receivers utilizing so much of the construction of Fig. 2 described above, the lining up or tracking of the two tunable circuits involves the simple factory adjustment of sliding sections 12, 13 and 14 in an axial direction to positions which produce the most satisfactory results. By suitable means, such as a drop of solder or a piece of adhesive tape between sections, they may be sealed in place. It may be desirable, however, in some instances, to provide means whereby the circuits may be realigned by the user or the service man at some future time. Adjusting means of this nature are shown in Fig. 2 in the form of drive screws or rods 15, 16 and 17 which cooperate, respectively with the shield sections 12, 13 and 14. The threaded end 18 of each screw engages a tapped hole in the corresponding section. The other ends of the screws extend through a partition 19 or other fixed part of the receiver, and, by means of "C" washers 20, or other suitable means, the drive screws are permitted to rotate without imparting axial movement thereto. Rotation of the drive screws, however, permits of relative adjustment of the various sections.

Figure 3:
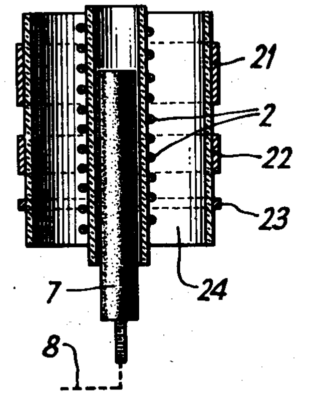

A further modification is disclosed in Fig. 3 wherein the shield is constituted by a plurality of coaxially arranged metallic rings 21, 22 and 23 of various widths slidably mounted on an insulating form 24. An exact mathematical treatment of the inductance-reduction of a relatively long solenoid by a short coaxial cylindrical metallic shield would be extremely difficult. However, in an article by A. G. Bogle in J. I. E. E., vol. 87, pages 299–316, Sept. 1940, entitled "The Effective Inductance and Resistance of Screened Coils," measurements of such assemblies have been made. From his work, it may be determined that the decrease in inductance of long slender solenoids varies approximately as the ⅔ power of the ratio of shield length to the coil length. Obviously, then, a wider ring acts to reduce the coil inductance more than a narrower ring. With this arrangement the several rings are adjustable by being slid along the insulating form and then finally sealed in place upon securing the desired alignment or tracking relation.

Figure 4:
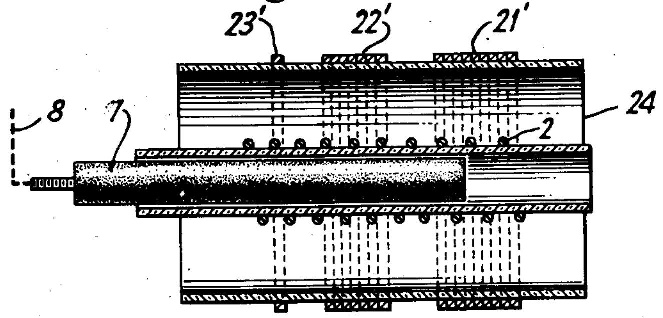

As a variation of the modification shown in Fig. 3, there may be employed a plurality of narrow rings of uniform width as shown in Fig. 4. By sliding together or bunching several such rings at several places along the length of the coil, the desired decrease in inductance can be secured. Thus, by way of example, element 21' may be formed by six rings bunched together, element 22' by three rings and element 23' may be formed by only one ring. In this way the width of the various ring assemblies and their number may be varied over wide limits in order to effect the desired result.

A means of securing various amounts of inductance control is in the choice of the material used for the shield, or for the component sections of the shield. Thus, where the entering end of the core and coil must actually be aided somewhat rather than act in inductance changing ability, the sections 14 and 23 of the assemblies shown in Figs. 2 to 4 may be formed of powdered iron or other suitable magnetic material. This is advantageous for those cases where the conditions for proper tracking require a steeper than ordinary oscillator tuning curve at the high frequency end of the band.

Figure 5:
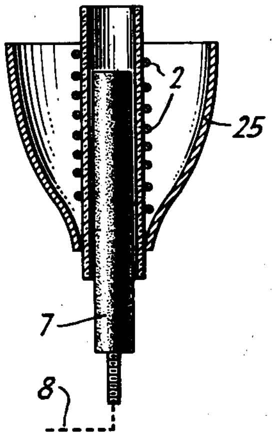

A still further modification of the invention involves the placing of a suitably formed magnetic shield 25 (of magnetite, or powdered iron, for example) around the oscillator coil as shown in Fig. 5. The effect of this type of shield is that of increasing the coil inductance, instead of reducing it. In this modification the flare or taper of the shield is in the reverse direction from what it is in the previous figures since it is desired to have the steepest inductance change at the entering end of the coil. For the normal superheterodyne receiver in which the oscillator frequency ($fo$) is higher than the signal frequency ($fs$), i. e. $fo=fs+$I. F., the oscillator tuning range will now be too large and may be reduced by suitable means such as are well known in the art, viz: oscillator core of low permeability; smaller diameter oscillator core; larger diameter oscillator coil form, etc. The magnetic shield of Fig. 5 may, as in the case of Figs. 2 to 4, be composed of several sections which may be adjustable in a similar manner.

It is possible, although in general not preferred, to use the shaped shields on the coil of the signal frequency circuit rather than on the oscillator coil. In this case, the shape of the shield would have to be reversed with suitable modifications necessitated by the difference in the signal frequency and the oscillator ranges. Suitable means would be employed to produce the required oscillator and signal frequency ranges.

Figure 6:
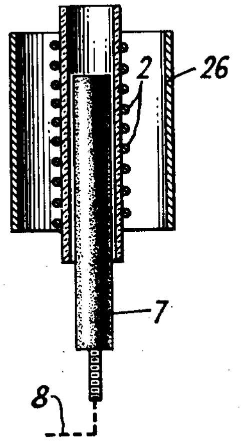

A still further embodiment is shown in Fig. 6 wherein a coaxial metallic shield 26 (without limitation as to shape, i. e., may be round, rectangular, square, etc. and not tapered or otherwise formed) is placed around the oscillator coil 2 merely to reduce the tuning range, i. e., to secure the two end tracking points. This is the equivalent of the use of a larger diameter coil form, or an oscillator core of lower permeability, or a smaller diameter oscillator core, etc. Other well known means of the prior art could be used to secure a third, and if desired, further tracking points.

It is possible also to use specially shaped shields on both the signal frequency and the oscillator coils as indicated in Figure 1 by the shields 9 and 9'. This may be done to change the shape of the tuning curve in a desired manner, i. e., improved dial distribution of frequencies. Suitable means would then be used to secure the proper ranges for all circuits of the receiver.

In general, the signal frequency and oscillator coils as used in the several embodiments above described are of substantially the same length. The cores are also of the same length. The signal frequency and the oscillator coils may each be uniformly wound, that is, a uniform pitched winding, but the windings of the two coils will not be identical. By way of example, the signal frequency coil may be universal progressively wound whereas the oscillator coil may be a single layer solenoid winding. As to the signal frequency and oscillator coil forms, they may, or may not, be of the same diameter depending upon the particular arrangement employed, the intermediate frequency, and the signal frequency and the oscillator frequency ranges.

While I have shown and described several embodiments of my invention, it will be understood that various modifications and changes will occur to those skilled in the art without departing from the spirit and scope of this invention.

What I claim is:

1. In a variable permeability tuning system for a superheterodyne receiver, a signal frequency circuit and an oscillator circuit, a tuning inductance coil and a movable tuning core included in each of said circuits, said cores being interconnected for uni-controlled tuning of said circuits, and means for causing a decrease in the effective inductance of the oscillator coil to an extent such that the oscillator circuit substantially tracks with the signal frequency circuit in the conjoint tuning of said circuits, said means comprising a plurality of metallic ring members which encircle the oscillator coil and are axially spaced along the length of the coil, said members being of different widths and placed along the length of the coil at different locations in order to affect the inductance of various coil sections to different degrees.

2. In a variable permeability tuning system for a superheterodyne receiver, a signal frequency circuit and an oscillator circuit, a tuning inductance coil and a movable tuning core included in each of said circuits, said cores being interconnected for uni-controlled tuning of said circuits, and means for causing a decrease in the effective inductance of the oscillator coil to an extent such that the oscillator circuit substantially tracks with the signal frequency circuit in the conjoint tuning of said circuits, said means comprising a plurality of metallic ring members of uniform width which encircle the oscillator coil and are axially spaced along the length of the coil, varying numbers of said members being bunched together at different locations along the length of the coil in order to affect the inductance of various coil sections to different degrees.

3. A tuning system for a superheterodyne receiver comprising a pair of circuits each having a coil which is tunable by means of an associated movable magnetic tuning core which tunes each said coil through a different frequency range, and means cooperatively related with the coil of each of said circuits for modifying the rate of inductance change of said coils in a manner such that substantially constant tracking is obtained between said circuits over their respective tuning ranges upon simultaneous adjustment of the tuning cores.

4. In a variable permeability tuning system for a superheterodyne receiver, a signal frequency circuit and an oscillator circuit, a tuning inductance coil and a movable tuning core included in each of said circuits, said cores being interconnected for uni-controlled tuning of said circuits, and a shaped shield having differently dimensioned shield portions axially spaced along the length of the coils and encircling each of said coils separately whereby the oscillator circuit substantially tracks with the signal frequency circuit in the conjoint tuning of said circuits, and the frequency distribution on the dial is improved.

5. A variable permeability tuner comprising an inductance coil, a paramagnetic core movable with respect to said coil for tuning said tuner through a predetermined frequency range, and a conducting shield arranged externally of and substantially coextensive with said coil and having a circular cross section co-axial with said coil and with a diameter which varies along the length of said coil thereby altering in a predetermined manner the rate of inductance change caused by a movement of said core with respect to said coil.

6. A variable tuner comprising an inductance coil, means adapting said coil for tuning said tuner through a predetermined frequency range, and a thin metallic shield arranged externally of and substantially coextensive with said coil said shield being arranged close to said coil and having a periphery which varies in spacing with respect to and along the length of said coil thereby varying in a predetermined manner the inductance along the length of said coil as a function of said peripheral spacing with respect to said coil.

7. A variable permeability tuner comprising an inductance coil, a paramagnetic core movable with respect to said coil for tuning said tuner through a predetermined frequency range, and a non-magnetic electrically conducting shield arranged externally of and substantially coextensive with said coil, said shield having a diameter which varies in steps along the length of said coil in a predetermined manner thereby altering the rate of inductance change caused by a movement of said core with respect to said coil.

8. A variable permeability tuner comprising an inductance coil, a paramagnetic core movable with respect to said coil for tuning said tuner through a predetermined frequency range, and a metallic shield arranged externally of and substantially coextensive with and encircling said coil to shield said coil, said encircling shield having sections of variable area along the length of said coil thereby altering in a predetermined manner the rate of inductance change caused by a movement of said core with respect to said coil.

9. A variable permeability tuner comprising an inductance coil, a paramagnetic core movable with respect to said coil for tuning said tuner through a predetermined frequency range, a shield arranged externally of said coil to shield said coil, said shield consisting of metallic sections of different peripheries which are substantially coextensive and coaxial with said coil, said sections being arranged in telescoped relation with one another, and means for adjusting different ones of said sections in an axial direction as to alter in a predetermined manner the rate of inductance change caused by a movement of said core with respect to said coil.

WILLIAM F. SANDS.

REFERENCES CITED

The following references are of record in the file of this patent:

UNITED STATES PATENTS

| Number | Name | Date |
|---|---|---|
| 2,141,890 | Weis | Dec. 27, 1938 |
| 2,199,669 | Loughlin | May 7, 1940 |
| 2,222,387 | Wheeler et al. | Nov. 19, 1940 |
| 2,252,092 | Newman | Aug. 12, 1941 |
| 2,297,514 | Von Baeyer et al. | Sept. 27, 1942 |
| 2,323,376 | Harvey | July 6, 1943 |
| 2,340,749 | Harvey | Feb. 1, 1944 |
| 2,375,911 | Foster | May 15, 1945 |

FOREIGN PATENTS

| Number | Country | Date |
|---|---|---|
| 278,208 | Great Britain | Oct. 6, 1927 |
| 414,707 | Great Britain | Aug. 9, 1934 |
| 526,464 | Great Britain | Sept. 18, 1940 |